(12) United States Patent
Katakura et al.

(10) Patent No.: US 7,636,239 B2
(45) Date of Patent: Dec. 22, 2009

(54) STORAGE CONTROL DEVICE

(75) Inventors: Yasuyuki Katakura, Odawara (JP);
Toru Kobayashi, Odawara (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/970,807

(22) Filed: Jan. 8, 2008

(65) Prior Publication Data
US 2009/0059522 A1 Mar. 5, 2009

(30) Foreign Application Priority Data
Aug. 30, 2007 (JP) ............................. 2007-223739

(51) Int. Cl.
*H05K 7/20* (2006.01)
(52) U.S. Cl. ........................ 361/695; 361/694; 361/719
(58) Field of Classification Search ....................... None
See application file for complete search history.

(56) References Cited

U.S. PATENT DOCUMENTS

| | | | | |
|---|---|---|---|---|
| 4,931,904 A * | 6/1990 | Yiu | ............................. | 361/695 |
| 5,079,438 A * | 1/1992 | Heung | ........................ | 307/141 |
| 5,136,464 A * | 8/1992 | Ohmori | ....................... | 361/694 |
| 5,361,188 A * | 11/1994 | Kondou et al. | .............. | 361/695 |
| 5,402,312 A * | 3/1995 | Kinjo et al. | .................. | 361/695 |
| 6,388,879 B1 * | 5/2002 | Otaguro et al. | ............. | 361/695 |
| 7,430,017 B2 * | 9/2008 | Lee | ............................. | 348/558 |
| 2005/0036288 A1 * | 2/2005 | Shen et al. | ................... | 361/695 |
| 2005/0286221 A1 * | 12/2005 | Yamana et al. | ............... | 361/687 |
| 2007/0127207 A1 * | 6/2007 | Katakura et al. | ............. | 361/694 |
| 2007/0133168 A1 * | 6/2007 | Shabany | ...................... | 361/695 |

FOREIGN PATENT DOCUMENTS

JP 2007-156751 6/2007

* cited by examiner

*Primary Examiner*—Gregory D Thompson
(74) *Attorney, Agent, or Firm*—Brundidge & Stanger, P.C.

(57) ABSTRACT

A storage control device comprising a plurality of logic boards having a plurality of cooling objects, comprises a first cooling device for cooling the plurality of cooling objects on each of the logic boards, and a second cooling device for cooling at least one special cooling object out of the plurality of cooling objects on each of the logic boards.

23 Claims, 10 Drawing Sheets

STORAGE CONTROL DEVICE

CROSS-REFERENCE TO PRIOR APPLICATION

This application relates to and claims the benefit of priority from Japanese Patent Application No. 2007-223739, filed on Aug. 30, 2007, the entire disclosure of which is incorporated herein by reference.

BACKGROUND OF THE INVENTION

1. Field of the Invention

The present invention relates to a technology for cooling cooling objects in a storage control device.

2. Description of the Related Art

In a storage control device, a plurality of cooling target devices and components (hereafter called "cooling object(s)") are installed. A technology for cooling the cooling objects in a storage control device is disclosed, for example, in Japanese Patent Application Laid-Open No. 2007-156751.

For a cooling object, an upper limit value of a surface temperature (hereafter called "upper limit temperature") is defined. By the cooling device, the surface temperatures of all the cooling objects are maintained at the respective upper limit temperatures or less.

The upper limit temperatures of the cooling objects vary depending on the type of the cooling object. In some cases only an upper limit temperature of a small number of (1, for example) cooling objects is extremely lower than the upper limit temperatures of other cooling objects. In such a case, the capability of the cooling device is defined so that the surface temperatures of the small number of cooling objects are maintained to be the upper limit temperatures or less. Therefore in this case, the capability of the cooling device is defined to be high only for the small number of cooling objects, which is not efficient.

Also in order to increase the capability of a cooling device, normally it is necessary to increase the size of the cooling device. In the above case, the size of the cooling device may become too large, just for maintaining the small number of cooling objects at the upper limit temperatures or less, and it may become impossible to dispose the cooling device in the storage control device.

SUMMARY OF THE INVENTION

With the foregoing in view, it is an object of the present invention to efficiently cool cooling objects in a storage control device.

To achieve the above object, the present invention provides a storage control device comprising a plurality of logic boards having a plurality of cooling objects, further comprising a first cooling device for cooling the plurality of cooling objects on each logic board, and a second cooling device for cooling at least one special cooling object out of the plurality of cooling objects on each logic board.

DESCRIPTION OF THE PREFERRED EMBODIMENTS

Figure 1:
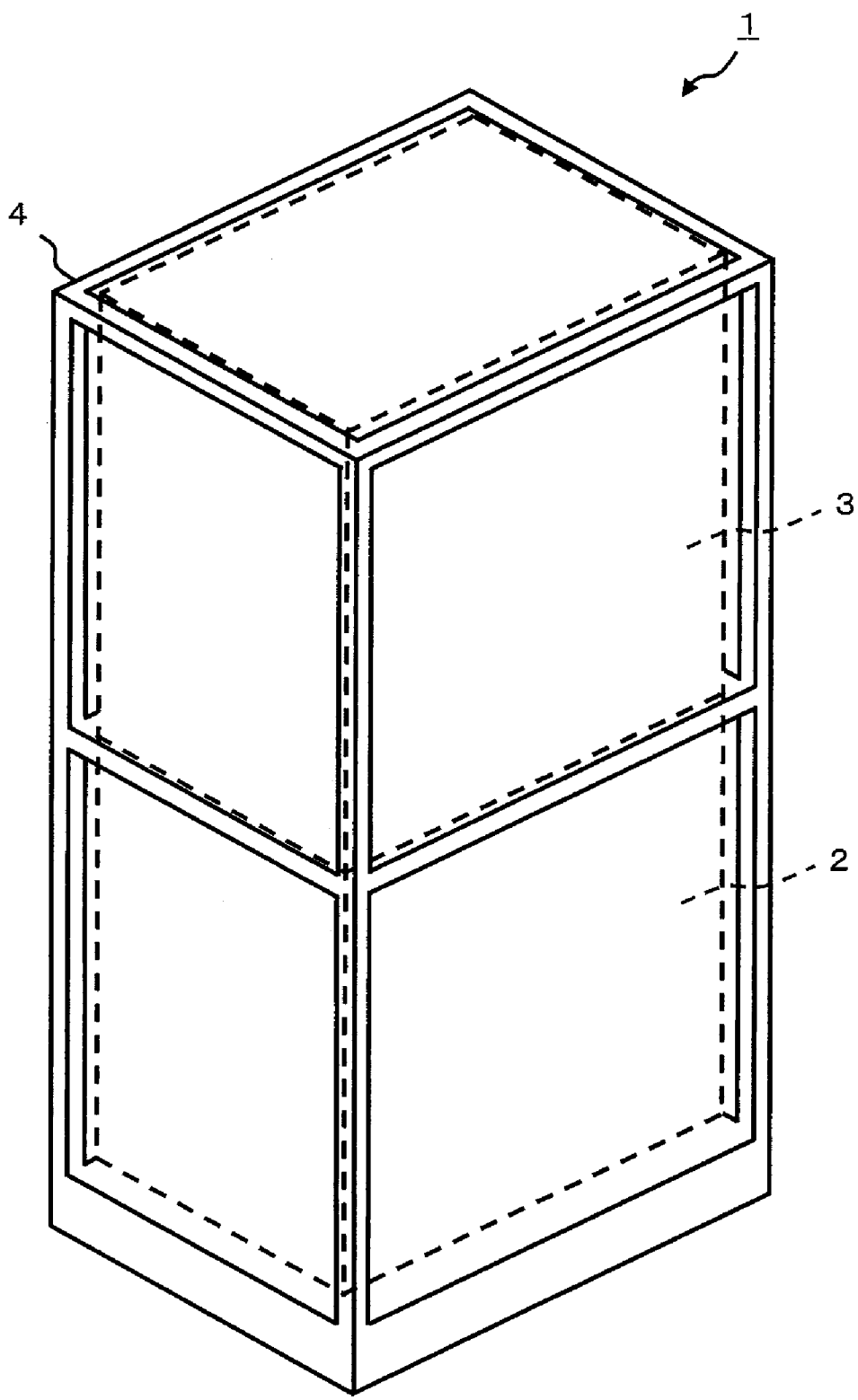
FIG. 1 is a perspective view depicting a storage device system having a storage control device according to an embodiment of the present invention.

According to Embodiment 1, a storage control device has a plurality of logic boards having a plurality of cooling objects. The storage control device has a first cooling device for cooling the plurality of cooling objects on each of the logic boards, and a second cooling device for cooling at least one special cooling object out of the plurality of cooling objects on each of the logic boards.

Embodiment 2 is Embodiment 1, wherein the plurality of logic boards positioned in a vertical direction are arrayed in a width direction of the storage control device respectively. The first cooling device is a suction type large fan disposed above the plurality of logic boards. Each of the logic boards further has an edge surface section, a second cooling device and a shield section. The edge surface section is formed at the front edge and/or the rear edge of the logic board. The second cooling device is a discharge type small fan, and this small fan is disposed on the edge surface section at a position facing the special cooling object. The shield section prevents air flow by the large fan from running into the air flow from the small fan to the special cooling object. Here "special cooling object" is a cooling object of which the upper limit temperature of the surface thereof is lower than the upper limit temperatures of the surface of the cooling objects other than the special cooling object.

Embodiment 3 is Embodiment 2, wherein the plurality of special cooling objects are disposed on the logic board at positions shifted in a vertical direction of the storage control device, (so that the special cooling objects do not overlap in the depth direction). A plurality of small fans are installed on the edge surface section at a plurality of positions corresponding to the plurality of special cooling objects respectively.

Embodiment 4 is one of Embodiment 2 and Embodiment 3, wherein the shield section is a wall extending on the edge surface section, from a position where the small fan is installed or a position lower than that position to a bottom end of the special cooling object or a position lower than that position.

Embodiment 5 is Embodiment 3, wherein the wall also plays a role of a guide for guiding air discharged by the small fan to the special cooling object.

Embodiment 6 is at least one of Embodiment 2 to Embodiment 5, wherein the size of the small fan is bigger than the size of the special cooling object. Each of the logic boards further has an air drawing section for drawing the air discharged from the small fan onto a surface of the special cooling object.

Embodiment 7 is Embodiment 6, wherein the shield section and the air drawing section are provided on the edge surface section.

Embodiment 8 is at least one of Embodiment 2 to Embodiment 7, wherein each of the logic boards has a memory module which is installed at a position lower than the center of the logic board and which extends in a depth direction of the storage control device, and a wind direction section for directing air flowing up from both sides of the memory module by the large fan to the center side of the logic board. The wind direction section is installed at the top end of the logic board.

Embodiment 9 is at least one of Embodiment 1 to Embodiment 8, wherein the special cooling object is disposed at a position closer to the second cooling device than the first cooling device. The cooling capability of the second cooling device is lower than the cooling capability of the first cooling device. For example, the capability of the first cooling device is a capability to maintain the temperatures of the cooling objects other than the special cooling objects at an upper limit temperatures (upper limit values of the surface temperature) thereof or less, and the capability of the second cooling device is a capability to maintain the special cooling object at an upper limit temperature thereof or less by cooling the special object together with the first cooling device.

Embodiment 10 is at least one of Embodiment 1 to Embodiment 9, wherein the special cooling object is a cooling object of which an upper limit temperature of the surface thereof is lower than upper limit temperatures of the surface of the cooling objects other than the special cooling object.

Embodiment 11 is at least one of Embodiment 1 to Embodiment 10, wherein the first cooling device is a suction type fan and the second cooling device is a discharge type fan. Air sucked in from outside the storage control device into inside the storage control device by the discharge type fan cools the special cooling object. Air sucked into the storage control device by the suction type fan and which cools the plurality of cooling objects, including the special cooling object, on each of the logic boards, and the air discharged into the storage control device by the discharge type fan and which cools the special cooling object, are discharged out of the storage control device by the suction type fan.

Embodiment 12 is at least one of Embodiment 1 to Embodiment 11, wherein the second cooling device is a cooling device smaller in size than the first cooling device. Each of the logic boards further has an edge surface section which is formed on the front edge and/or the rear edge of the logic board, and a discharge type fan disposed on the edge surface section at a position facing the special cooling object.

Embodiment 13 is at least one of Embodiment 1 to Embodiment 12, wherein a direction of air flow by the first cooling device and a direction of air flow by the second cooling device are different. Each of the logic boards further has a shield section for preventing air flow by the first cooling device from running into the air flow from the second cooling device to the special cooling object.

Embodiment 14 is Embodiment 13, wherein the shield section plays a role of a guide for guiding the air discharged by the second cooling device into the special cooling object.

Embodiment 15 is at least one of Embodiment 1 to Embodiment 4, wherein a plurality of second cooling devices are provided. The storage control device further has a cooling control section for increasing, when a failure occurs to one of the plurality of second cooling devices, a cooling capability of a second cooling device other than the failed second cooling device.

Out of the above Embodiment 1 to Embodiment 15, two or more arbitrary embodiments can be combined.

An embodiment of the present invention will now be described with reference to the drawings.

FIG. 1 is a perspective view depicting a storage device system 1 having a storage control device according to an embodiment of the present invention.

The storage device system 1 is comprised of a plurality of modules. The modules are, for example, a storage module 3 where a storage device is installed, and a logic module 2 for controlling the storage module 3. The storage control device according to the present embodiment corresponds to the logic module 2. The storage device system 1 is constructed as one or more integrated units, which are bodies 4 where a plurality of modules 2 and 3 are installed. The storage device system 1 has at least one logic module 2 and at least one storage module 3.

FIG. 1 shows the simplest configuration of the storage device system 1. The storage device system 1 in FIG. 1 is one body 4 where two modules 2 and 3 are mounted. A logic module 2 is disposed at the lower part of the body 4, and a storage module 3 is disposed at the upper part of the body 4 (that is, above the logic module 2). The positions of the logic module 2 and the storage module 3 may be reversed. The same types of modules (e.g. two logic modules 2) may be mounted in one body 4. In this case, however, the storage device system 1 of the present embodiment is comprised of two or more bodies 4 since at least one logic module 2 and one storage module 3 must be provided.

In FIG. 1, only the frame of the body 4 is shown, but the body 4 can be a case where the bottom face and the side faces are closed, and the front face and rear face are open. The body 4 may have a door on the front face and/or the rear face, which virtually completely covers the face(s) (front door and/or rear door). The door of the body 4 may have an air passing section for sucking air from the outside to the inside of the storage device system 1, or discharging air from the inside to the outside of the storage device system 1. The air passing section can have many holes, for example.

Figure 2:
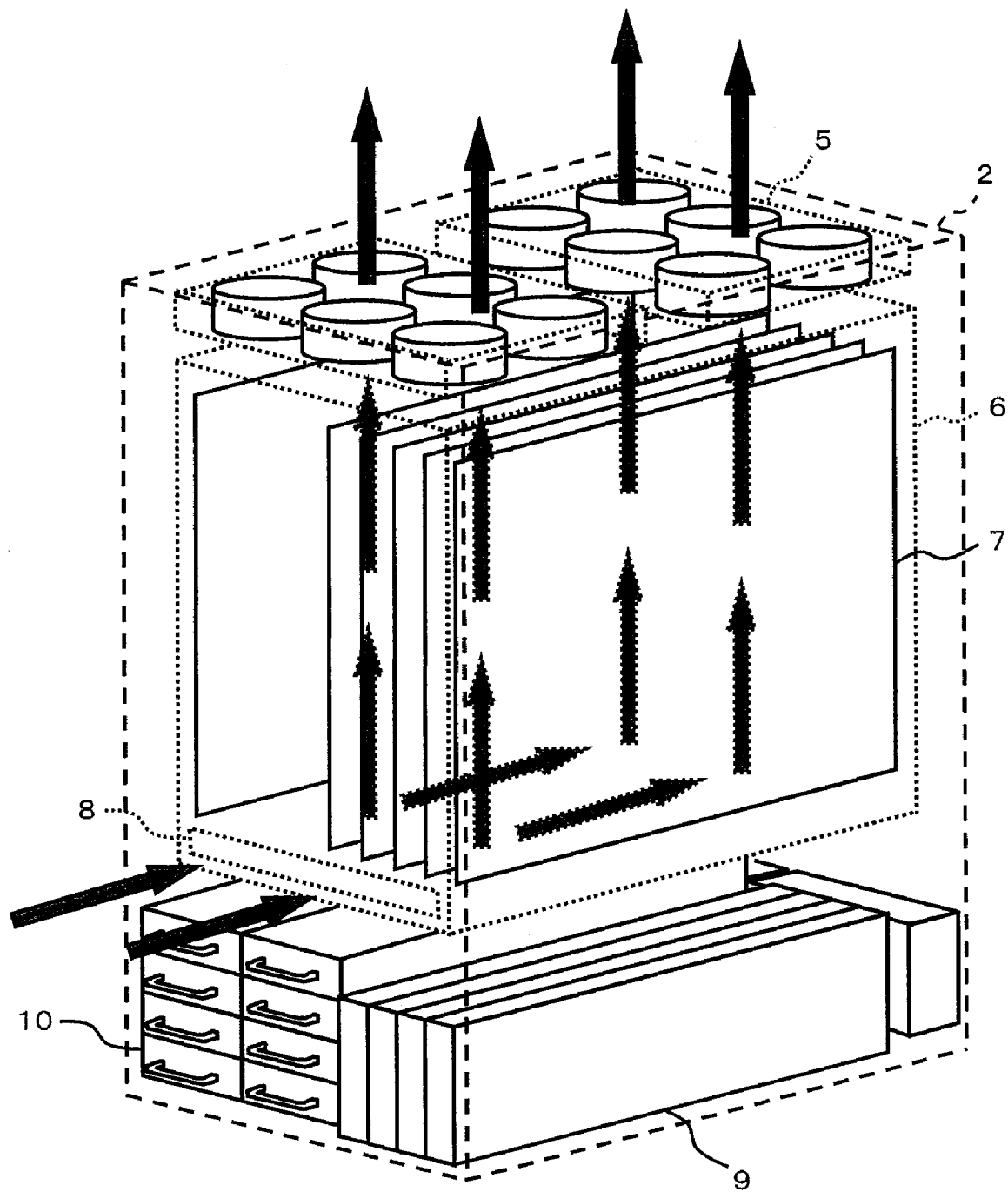
FIG. 2 is a perspective view depicting a logic module according to the present embodiment.

FIG. 2 is a perspective view of the logic module 2 according to the present embodiment. The left side of FIG. 2 corresponds to the front side of the storage device system 1.

The logic module 2 has logic fans 5, a logic box 6, logic power supplies 9 and batteries 10, for example.

On one side of the bottom area of the logic module 2 (right side viewed from the front), the logic power supplies 9 are disposed. The shape of the logic power supplies 9 are roughly rectangular-parallelepiped. The logic power supplies 9 are vertically placed, and a plurality of logical power supplies (four in FIG. 2) are disposed side by side. The logic power supplies 9 supply power with a predetermined voltage to the logic boards 7 and logic fans 5 in the logic box 6.

On the other side of the bottom area of the logic module 2 (left side viewed from the front face), batteries 10 are disposed. The shape of the batteries 10 are roughly rectangular-parallelepiped. The batteries 10 are horizontally placed, and a plurality of batteries (four in FIG. 2) are disposed stacked vertically. And a plurality of the stacked battery group 10 (two in FIG. 2) are disposed side by side. The batteries 10 supply power, having a predetermined voltage, to the logic boards 7 and logic fans 5 in the logic box 6 respectively for a short time when the power supply from the logic power supplies 9 is interrupted.

On the top area of the logic module 2, the logic fans 5 are disposed. The logic fan 5 is a device for cooling each device 7, 9 and 10 in the logic module 2 by allowing air in the logic module 2 to flow. The logic fan 5 can be one or a plurality of suction type fans which suck air in the logic module 2, and discharge it out of the logic module 2, for example. In the present embodiment, the logic fan 5 is assumed to be a suction type fan. As FIG. 2 shows, air in the logic module 2 flows upward, passes through the logic fans 5, and is discharged upward in the logic module 2. The air flow in the logic module 2 will be described later.

The logic box 6 is disposed between the logic power supplies 9/batteries 10 and the logic fans 5 (that is, in the intermediate area of the logic module 2). The front face and/or rear face of the logic box 6 is/are open. A plurality of logic boards 7 are installed in the logic box 6. Each of the logic boards 7 is placed vertically (that is longitudinally), and is arrayed from left to right at roughly an equal interval so as to roughly cover the entire area in the logic box 6. The logic board 7 is inserted from the front face and/or the rear face of the logic box 6, and is connected to a back plane (circuit board) installed in a front face, rear face or center area of the logic box 6. There are various types of logic boards 7 included in the logic box 6. For example, a logic board where a microprocessor (MP) is mounted (hereafter called "MP board") 7m, a logic board where a switch (SW) is mounted, and a logic board where a cache memory (CM) is mounted. In the present embodiment, it is assumed that two MP boards 7m are disposed one each at the left and right sides (near both side faces of the logic box 6) respectively. If a plurality of logic boards 7 are disposed in the logic box 6, the edge surface sections (described later) formed on each logic board 7 are combined, and the front face and/or rear face of the logic board 6 is/are covered. The logic board 7 is disposed at a position away from the bottom face of the logic box 6 for a predetermined distance, so a port where air flows in (hereafter called an "air inlet 8") is created on the front face and/or rear face of the logic box 6 at a bottom area of the logic board 7. Air outside the storage device system 1 is drawn into the logic box 6 by the logic fans 5 via the air inlet 8. By the function of the logic fans 5, air flow in the logic box 6 becomes as follows. First air outside the storage device system 1 is drawn from the front face of the storage device system 1 to the bottom area of the logic board 7 in the logic box 6. The air drawn into the bottom area of the logic board 7 flows upward in the logic box 6, and reaches the logic fans 5. The air which reaches the logic fans 5 passes through the logic fans 5 and is discharged to the upper area of the logic module 2.

Figure 3:
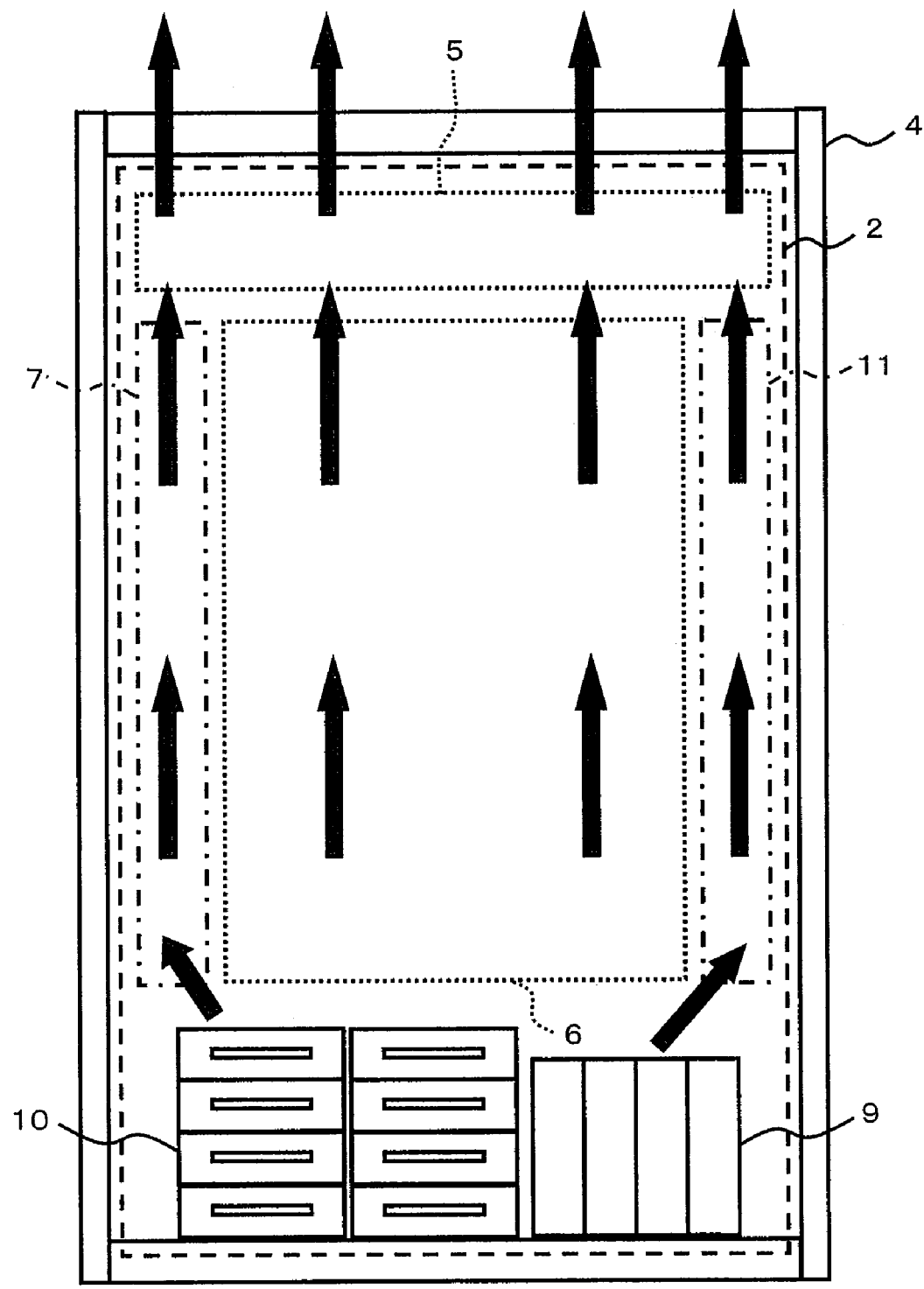
FIG. 3 is a front view depicting the logic module according to the present embodiment.

FIG. 3 is a front view depicting the logic module 2 according to the present embodiment.

As FIG. 3 shows, a predetermined space 11 is created between the left and right side faces of the logic box 6 and the corresponding side walls of the body 4 respectively. This space 11 is used for passing a cable of the logic power supply 9 and a back end cable for connecting the logic module 2 and storage module 3 through, and also for the passage of air in the logic module 2. This space 11 is hereafter called the "passage space".

Generally there are two types of air flow in the logic module 2. One is air flow in the logic box 6, as described above. The other is air flow outside the logic box 6, that is in a space where the logic power supplies 9 and batteries 10 are disposed (hereafter called "power supply space"), and in the passage space 11. The air flow outside the logic box 6 is as follows. First air outside the storage device system 1 is drawn into the power supply space from the air passing section created in the cover plate of the storage device system 1. The air drawn into the power supply space flows upward in the passage space 11 and reaches the logic fans 5. The air which reached the logic fans 5 passes through the logic fans 5 in the same way as the air which reached from the logic box 6, and is discharged to the area above the logic module 2.

Figure 4:
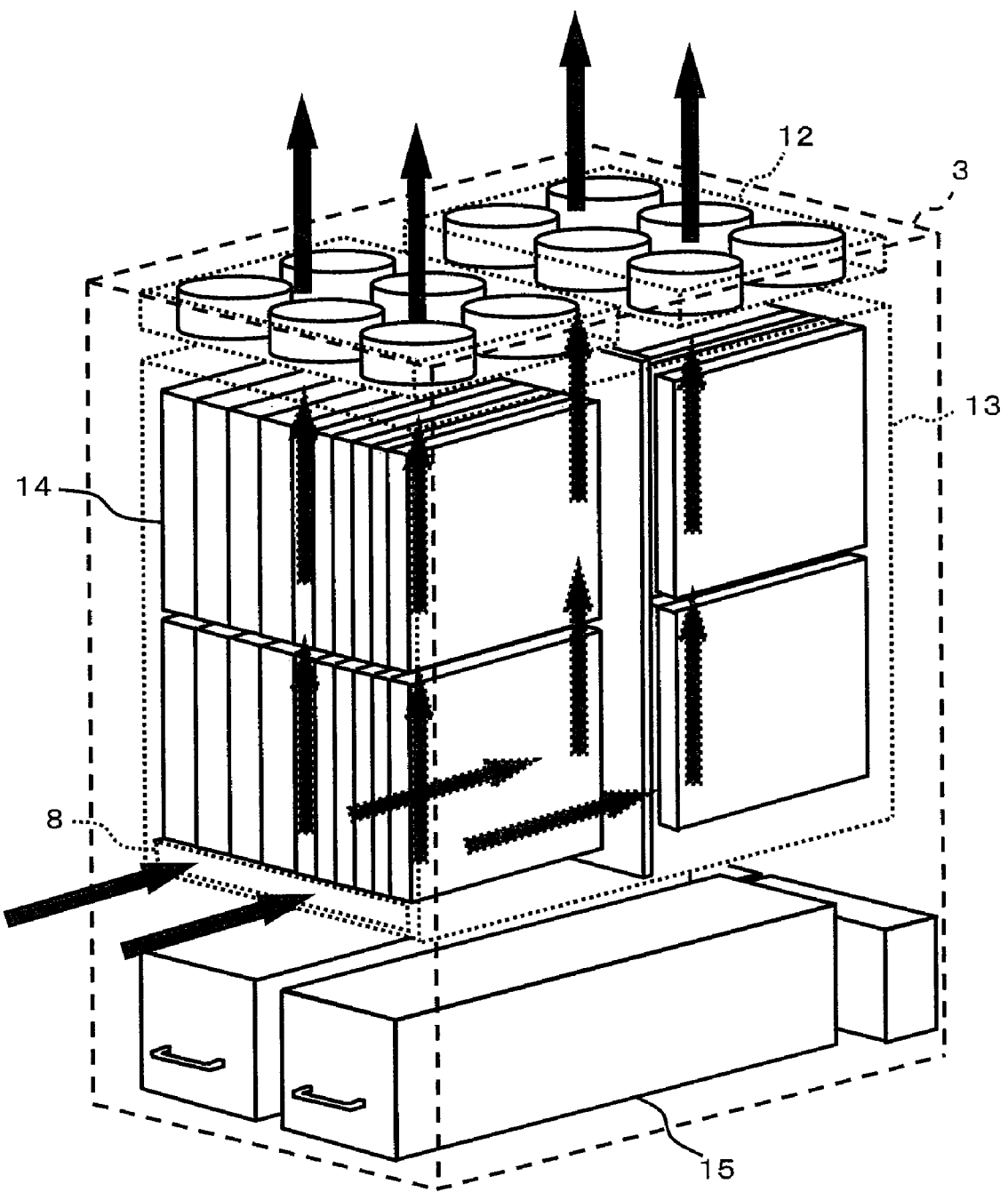
FIG. 4 is a perspective view depicting a storage module according to the present embodiment.

FIG. 4 is a perspective view depicting the storage module 3 according to the present embodiment. The left side of FIG. 4 corresponds to the front side of the storage device system 1.

The storage module 3 has storage fans 12, a storage box 13 and storage power supplies 15.

The storage power supplies 15 are disposed at the center of the bottom area of the storage module 3. The shape of the storage power supplies 15 are roughly rectangular-parallelepiped. Storage power supplies 15 are horizontally placed, and a plurality of storage power supplies (two in FIG. 4) are disposed side by side. The storage power supplies 15 supply power with a predetermined voltage to the storage box 13 and storage fans 12.

The storage fans 12 are disposed on the top area of the storage module 3. The storage fan 12 is a device for cooling each device 13 and 15 in the storage module 3 by allowing air in the storage module 3 to flow. The storage fan 12 can be a suction type fan which sucks air in the storage module 3 and discharges it out of the storage module 3, just like the logic fan 5. In the present embodiment, the storage fan 12 is assumed to be a suction type fan.

The storage box 13 is disposed between the storage power supplies 15 and storage fans 12 (that is, in the intermediate area of the storage module 3). The front face and/or rear face of the storage box 13 is/are open. A plurality of storage devices 14 are installed in the storage box 13. In FIG. 4, each of the storage devices is placed vertically, and arrayed from the left to right of the storage box 13. The storage devices 14 placed horizontally are disposed in two levels, the top and bottom, on both sides of the front face and rear face. An air inlet 8 is created on the front face and/or the rear face of the storage box 13 in an area below the storage devices 14 disposed in the lower level. The air inlet 8 is virtually the same as that described in the logic module 2, and air flow in the storage box 13 is also virtually the same as the air flow in the logic box 6.

Figure 5:
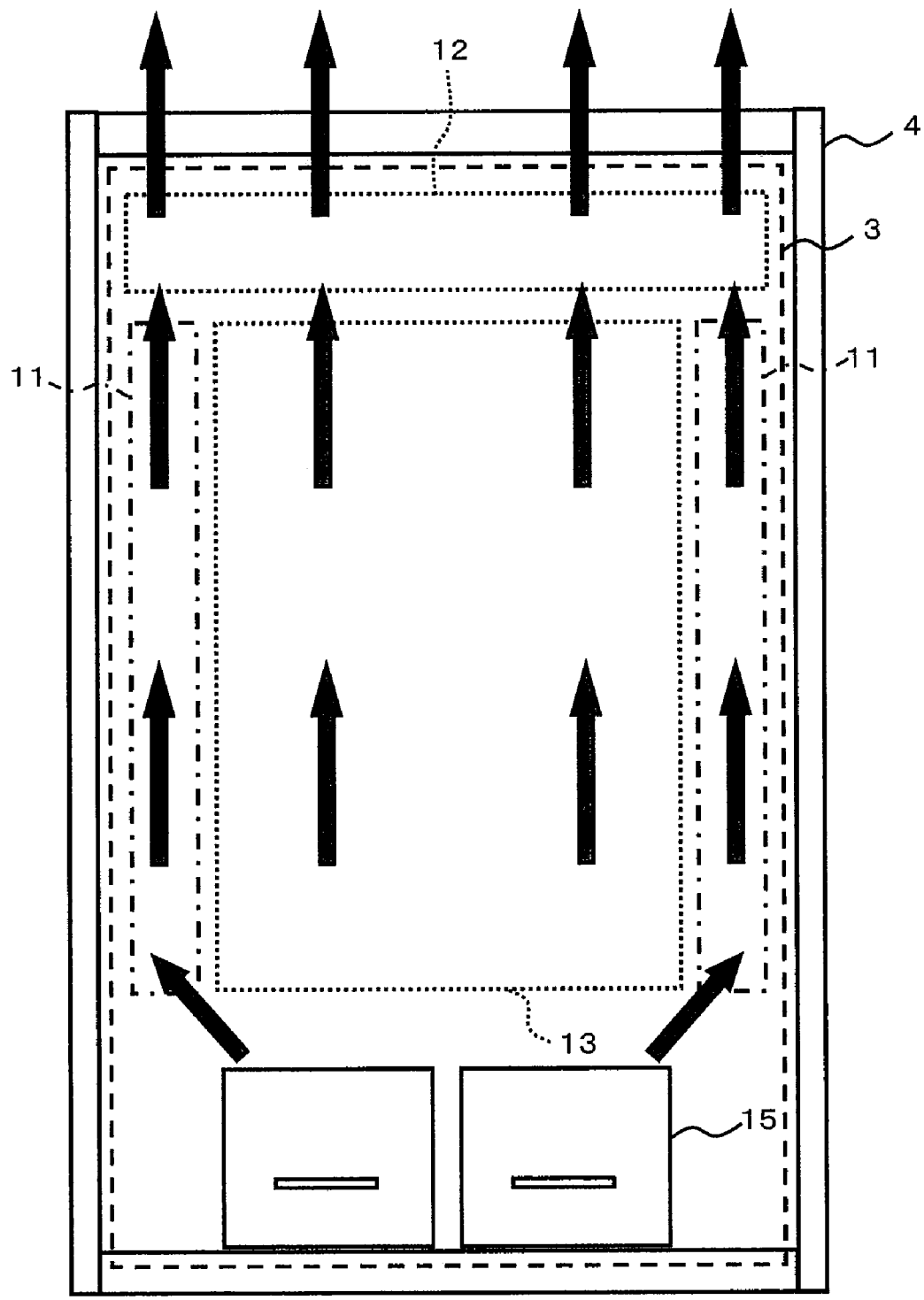
FIG. 5 is a front view depicting the storage module according to the present embodiment.

FIG. 5 is a front view depicting the storage module 3 according to the present embodiment.

Just like the case of logic module 2, a passage space 11 is created between the left and right side faces of the storage box 13 and the corresponding side walls of the body 4 respectively. The air flow is different between the inside and outside of the storage box 13, in the case of the storage module 3 as well, which is virtually the same as the case of the logic module 2. Description on the air flow of the storage module 3 is omitted.

Figure 6:
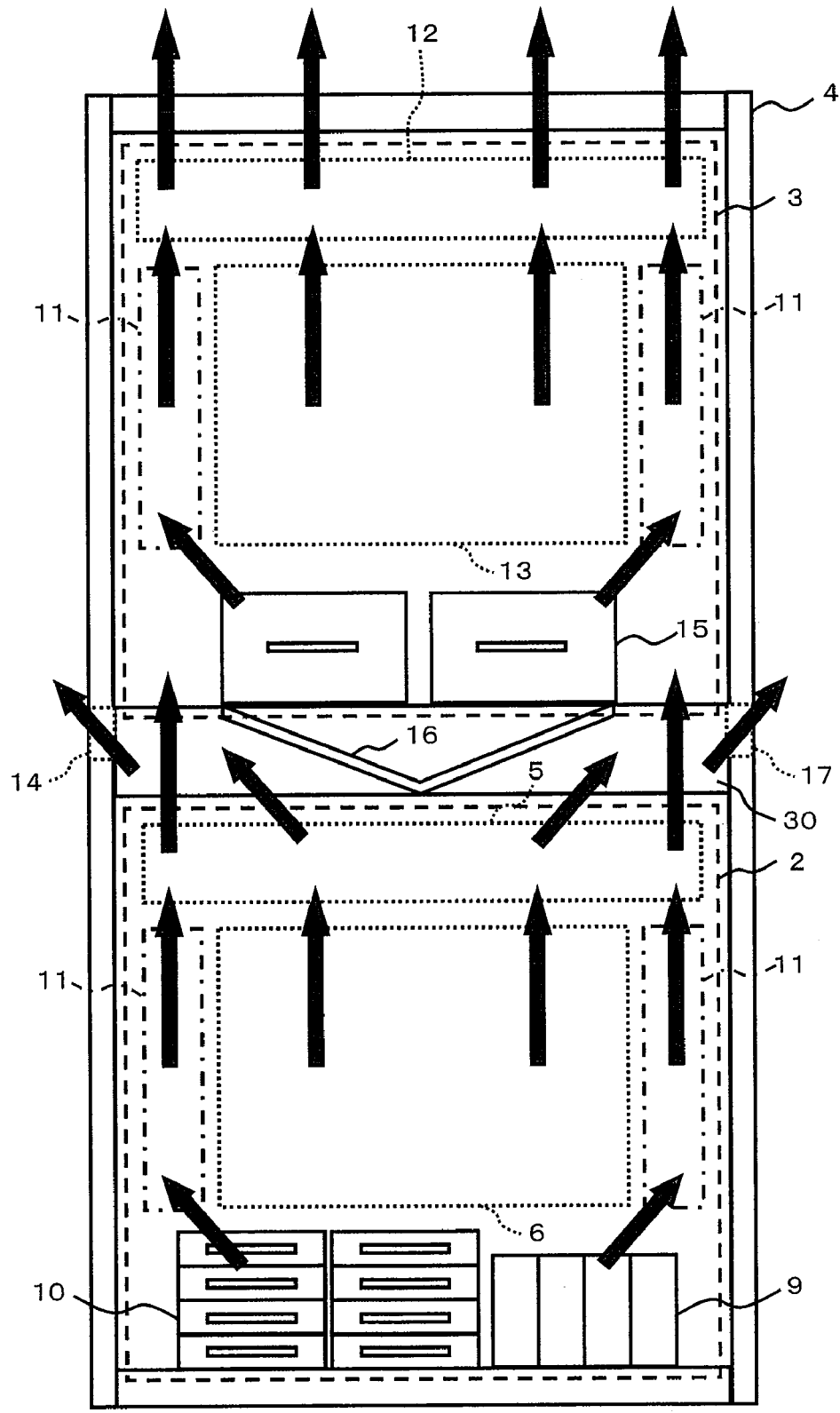
FIG. 6 is a front view depicting a storage device system according to the present embodiment.

FIG. 6 is a front view depicting the storage device system 1 according to the present embodiment.

FIG. 6 is a front view of the storage device system 1 shown in FIG. 1, wherein the storage module 3 is disposed above the logic module 2. As FIG. 6 shows, a V-shaped wind detection plate 16 is installed in a space created between the logic module 2 and the storage module 3 (hereafter called "inter-module space") 30. The V-shaped wind direction plate 16 is a component created by bending a plate element or combining two plate elements, so as to have a V-shape when viewed from the front. The depth of the V-shaped wind direction plate 16 can roughly be the same as the depth of the body 4. The V-shaped wind direction plate 16 separates the air flowing upward in the inter-module space 30 into both side face sides. An opening (e.g. hole or slit) 17 is created at an area on both side faces of the body 4 that contacts the inter-module space 30.

The air flow in the body 4 is as follows. As mentioned above, the air in the logic module 2 flows upward due to the function of the logic fans 5, passes through the logic fans 5 and reaches the inter-module space 30. The air which reached the inter-module space 30 is drawn into areas near both side faces of the body 4 (that is, the extended areas of the passage space 11) along the slopes of the V-shaped wind direction plate 16. A part of the air drawn near the side faces passes through the opening 17, and is discharged out of the storage system 1. The remaining air flows upward due to the function of the logic fans 5 and storage fans 12, and reaches the areas near the side faces at the bottom of the storage module 3.

As mentioned above, the air in the storage module 3 flows upward due to the function of the storage fans 12, passes through the storage fans 12, and is discharged out of the storage device system 1. Here the air, which flows from the logic module 2, which reaches the areas near the side faces of the bottom of the storage module 3, and passes through the sides of the storage power supplies 15, flows upward in the passage space 11, and is discharged out of the storage device system 1. Therefore the air which flows from the logic module 2 is warmed up by heat from each device of the logic module 2, however this warm air is discharged out of the storage device system 1 without interrupting the cooling of each device of the storage module 3.

Figure 7:
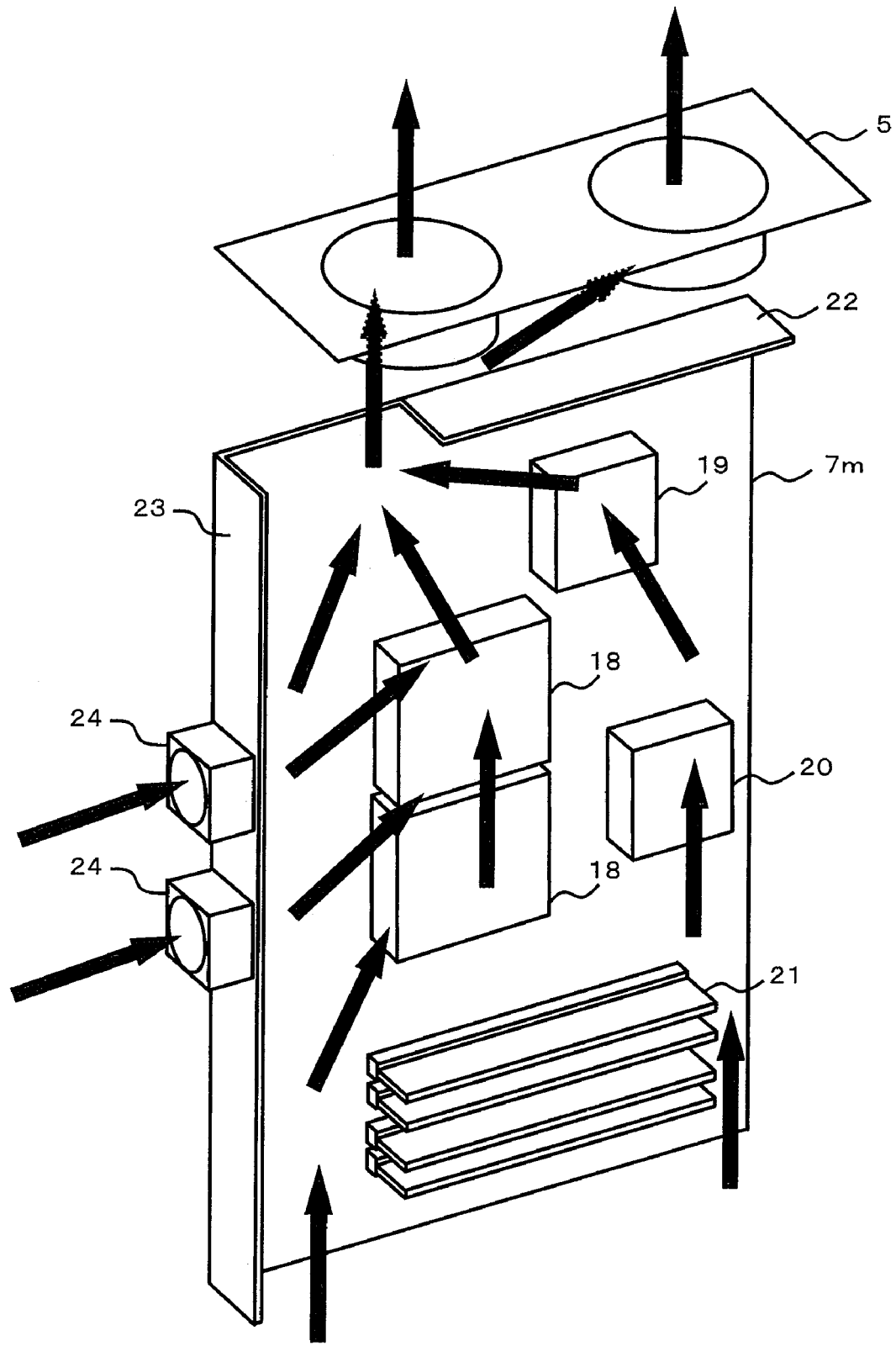
FIG. 7 is a perspective view depicting an MP board according to the present embodiment.

FIG. 7 is a perspective view depicting an MP board 7m according to the present embodiment.

In the MP board 7m in FIG. 7, the front side (left side in FIG. 7) corresponds to the front face side of the storage device system 1, and the rear side (right side in FIG. 7) corresponds to the rear face side of the storage device system 1. As the logic fans 5 existing above the MP board 7m show, the upper side in FIG. 7 corresponds to the upper side of the storage device system 1, and the lower side in FIG. 7 corresponds to the lower side of the storage device system 1.

One face (front face) of the MP board 7m has MP 18, a memory (e.g. module having a plurality of memory chips) 21, ESB (Enterprise Service Bus) 19 which is an event driven type high function message bus, and MCH (Memory Controller Hub) 20 for connecting the MP 18 and the memory 21. The MP 18, ESB 19, MCH 20 and memory 21 are heating elements, and are the cooling target components of the logic fans 5, in other words, the cooling objects of the logic fans 5. In the present embodiment, the logic power supplies 9 and the batteries 10 are also the cooling objects of the logic fans 5.

As long as only the cooling objects on the MP board 7m are the concern, the upper limit temperature (upper limit value of surface temperature) of the MP 18 is strikingly low compared with other cooling objects. For example, the upper limit temperature of the other cooling objects are about 100° C., but the upper limit temperature of the MP 18 is about 60° C. In such a case, logic fans 5 that can maintain the surface temperature of the MP 18, which has the lowest upper limit temperature, at its upper limit temperature or less (that is, about 60° C. or less), are required. However if such logic fans 5 are used, the surface temperatures of the ESB 19, MCH 20 and memory 21, of which upper limit temperatures are about 100° C., are also maintained to an equivalent level as the MP 18. The structure and heating value are different depending on the component, so the surface temperature varies depending on the component, but if the surface temperature of the MP 18 is maintained at 60° C., then the surface temperatures of the other components are expected to be maintained at about a 50° C. to 70° C. range. In other words, the capacity of the logic fans 5 could be a little lower since the upper limit temperatures of the ESB 19, MCH 20 and memory 21 are still higher than the upper limit temperature that can be maintained by the logic fans 5, but the capability of the logic fans 5 must be high just to maintain the MP 18 at its upper limit temperature or less. As a consequence, if the upper limit temperature of a small number (e.g. one) of components is strikingly lower than other components, then the capability of the logic fans 5 must be increased only for this small number of components, which is not efficient.

Available methods to increase the capability of the logic fans 5 are to increase the rotation speed of the logic fans 5, or to replace the logic fans 5 themselves with logic fans 5 having higher capabilities, for example. In the case of the former, power consumption increases and the noise during operation of the fans increases. And in the case of the later, the power consumption increases just like the former, and the purchase cost also increases. Generally the size of the fan becomes larger as the capacity thereof increases, so the size of the logic fan 5 increases, which is another problem. A minimum capability of the logic fan 5 required to maintain the MP 18 at the upper limit temperature or less is, for example, several times (e.g. four times) the minimum capability to be required to maintain the cooling objects, other than the MP 18, at the upper limit temperature or less. Here the capability of the fan is based on capacity. Normally in the case of a suction type (or discharge type) fan used for the logic fan 5, the capability thereof is correlated with the size thereof, and, for example, about 3 times of volume is required to exhibit about 4 times of capability. In other words, the size of the logic module 2 increases so much just to cool the MP 18 that the logic module 2 may no longer fit in the body 4.

To solve the above problem, the MP 18 is intensively cooled in the present embodiment. In other words, a fan 24 dedicated to cooling the MP 18 is provided. Hereafter this fan 24 is called the "assist fan 24". And because of this, the MP 18 is cooled not only by the logic fans 5, but also by the assist fans 24. Therefore even if the logic fans 5 alone cannot maintain the MP 18 at the upper limit temperature or less, the MP 18 can be maintained at the upper limit temperature or less by both the logic fans 5 and the assist fans 24. In the case of the above mentioned example, a fan that can maintain the ESB 19, MCH 20 and memory 21 at about 100° C. or less is used for the logic fan 5, and a fan that can maintain the MP 18 at about 60° C. or less, when combined with the above mentioned logic fan 5, is used for the assist fan 24. By this, the above mentioned problems of efficiency and size of the fans is solved. The assist fan 24 can be a discharge type fan which is smaller (and has lower performance) than the logic fan 5. The assist fan 24 is disposed near the MP 18 at a position where the air discharged by the assist fan 24 can cool the MP 18 and the air can be sucked by the logic fan 5. The position of the assist fan 24 will be described later. A plurality of the assist fans 24 may be installed according to the capability thereof. In other words, the number of assist fans 24 can be decided on by considering the size of an assist fan, which is possible to dispose (or considering the capability of one assist fan 24), so that the MP 18 can be maintained at the upper limit temperature or less. The assist fan 24 is installed on the edge surface section 23 of the MP board 7m, so it is unnecessary to provide a dedicated space for installing the assist fan 24 on the MP board 7m or any other location.

With reference to FIG. 7, an example of the arrangement of the cooling objects and the assist fans 24 on the MP board 7m will be described. As FIG. 7 shows, the memory 21 is disposed in the lower area of the MP board 7m such that the longitudinal direction thereof becomes roughly perpendicular to the vertical direction (that is, the direction of air flow). In other words, the memory 21 is disposed to be a wall to interrupt the air flow to the MP 18. The MP 18 and the MCH 20 are disposed above the memory 21 with a predetermined space. The memory 21 and the MCH 20 have a thin rectangular-parallelepiped shape, and are disposed on the MP board 7m such that one of the widest surfaces thereof contacts the MP board 7m respectively. In FIG. 7, two MPs 18 are disposed at positions which do not overlap when viewed from the front, such as at the top and bottom positions. The ESB 19 is disposed above the MP 18 and MCH 20 at a position between them (e.g. roughly at the center). The ESB 19 similarly to the MP 18 and MCH 20 has a thin rectangular-parallelepiped shape, and is disposed on the MP board 7m such that one of the widest surfaces thereof contacts the MP board 7m.

On the top end of the MP board 7m in an area closer to the rear face (above the ESB 19 and MCH 20), the plate-shaped first logic wind direction section (e.g. wind direction plate) 22 is installed toward the front face side of the MP board 7m, so as to roughly form a right angle with the surface of the MP board 7m. In an area (roughly the entire area) at the edge of the front face side (front edge) of the MP board 7m, the plate type edge surface section 23 is installed toward the front face side of the MP board 7m (right face side of the body 4), so as to roughly form a right angle with the surface of the MP board 7m. The assist fan 24 is disposed on the edge surface section 23 at a position to be a similar height as the MP 18 (a position facing the MP 18), so that the air outlet faces the MP 18. By disposing the fan in this way, the air inlet of the assist fan 24 faces the front face side of the storage device system 1. As a result, the assist fan 24 can suck air from outside the storage device system 1 via the air passing section created on the door of the storage device system 1 (door of the body 4), and discharge the air to the MP 18. If the MP board 7m is inserted from both the front face and rear face of the logic box 6, or if the MP 18 is disposed on both the front face side (e.g. near the front edge) and rear face side (e.g. near the rear edge) of the MP board 7m, for example, the edge surface section 23 may be created on the entire surface of the edge at the rear face side (rear edge) of the MP board 7m instead of or in addition to creating the edge surface section 23 in an entire area of the edge at the front face side (front edge) of the MP board 7m, so as to dispose the assist fans 24 on this edge surface section 23. In this case, the air inlets of the assist fans 24 face the rear face side of the storage device system 1, so the assist fans 24 can suck air from outside the storage device system 1 via the air passing section formed on the door on the rear face side of the storage device system 1, and discharge the air to the MP 18.

Now the air flow on the MP board 7m will be described. The air on the MP board 7m generally flows from the bottom to the top due to the function of the logic fans 5. In FIG. 7, the memory 21 is disposed such that the longitudinal direction thereof is roughly perpendicular to the air flow direction, so the air flow is blocked in the range of the longitudinal direction of the memory 21. Therefore the air at the bottom area of the MP board 7m flows to the top of the memory 21 via both sides of the memory 21.

If the assist fans 24 and the first logic wind direction section 22 are not installed, air which entered from both sides of the memory 21 flows upward since there is nothing to interrupt the flow of air. Therefore the flow of air becomes faster in areas when the areas on both sides of the memory 21 (partial areas on both sides of the memory 21 on the MP board 7m) are extended upward (that is, an area close to the front face, and an area close to the rear face of the MP board 7m), but the flow of the air becomes slower in areas when the area where the memory 21 is disposed is extended upward (that is, an area close to the center of the MP board 7m). Since the cooling objects are disposed in an area close to the center, as described above, the cooling efficiency in this case is not very good.

If the first logic wind direction section 22 is installed, on the other hand, the first logic wind direction section 22 blocks the air coming from the area close to the rear face of the MP board 7m. Therefore the air which entered from the area close to the rear face of the MP board 7m curves and flows toward the front face side. In this example, it is assumed that the rear face of the logic box 6 is closed, or the edge surface section 23 is created in the entire edge at the rear face side of the MP board 7m. Because of this, air flow at ESB 19, which is disposed in an area slightly closer to the front face side than to the rear face side, becomes faster, and the cooling efficiency for ESB 19 increases.

If the assist fans 24 are installed, the cooling efficiency for the MP 18 increases, since each assist fan 24 itself is a fan for intensively cooling the MP 18. In addition to this, air is discharged from the assist fans 24 to the MP 18 (that is, in roughly a horizontal direction from the front face to the rear face), so air flowing through the area close to the front face of the MP board 7m from the bottom area curves toward the rear face side due to the influence of the flow of the air discharged from the assist fans 24. Because of this, the air which entered from the bottom area passes through the area near the MPs 18 along with the air from the assist fans 24, so the cooling efficiency for the MPs 18 further improves.

Figure 8:
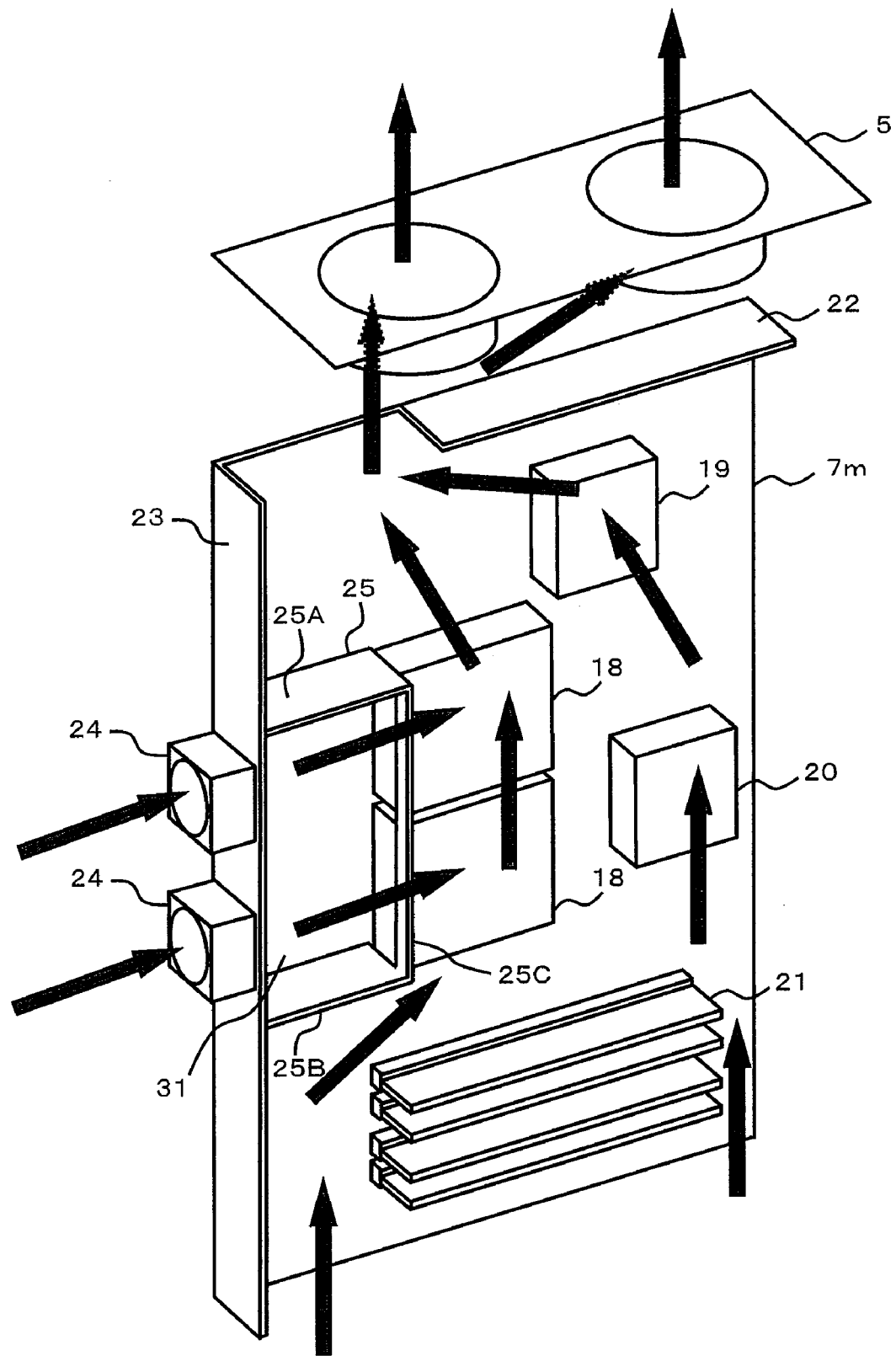
FIG. 8 is a perspective view depicting a variant form of the MP board according to the present embodiment.

FIG. 8 is a perspective view depicting a variant form of the MP board 7m according to the present embodiment.

The differences from FIG. 7 will primarily be described herein below. As FIG. 8 shows, a second logic wind direction section 25 is further installed in the MP board 7m. The second logic wind direction section 25 is disposed so as to enclose the space 31 between the assist fans 24 and the MPs 18. In other words, the second logic wind direction section 25 is comprised of a plate type element 25A, which extends (e.g. horizontally) from a first position on the rear face of the edge surface section 23 to the MP 18 at the top (e.g. top edge or higher position thereof), a plate type element 25B, which extends (e.g. horizontally) from a second position (position lower than the first position) on the rear face of the edge surface section 23 to the MP 18 at the bottom (e.g. bottom edge or lower position thereof), and a plate type element 25C which connects the end of the plate type element 25A and the end of the plate type element 25B. The first position is a position at the top edge of the assist fans 24 or higher position, for example. The second position is a position at the bottom edge of the assist fans 24 or lower position. The respective widths of the plate type element 25A and the plate type element 25B can be a thickness of the MP 18 or more. The plate type elements 25A and 25B function as guides for guiding air from the assist fans 24 to the MPs 18. The plate type element 25B also functions as a shield for blocking the air flowing by the logic fans 5 running into the air flowing from the assist fans 24 to the MPs 18. The plate type element 25C is an effective element for drawing the air from the assist fans 24 to the surfaces of the MPs 18 if the width of the assist fan 24 is wider than the thickness of the MP 18. Instead of the plate element 25C, another kind of element, such as a taper which extends from the rear face of the edge surface section 23 to the area near the front face of the MP 18, can be used. This second logic wind direction section 25 is installed, not on the MP board 7m, but on the edge surface section 23, and is slightly away from the MP board 7m. Therefore it is unnecessary to create an area for installing the second logic wind direction section 25 on the MP board 7m.

The second logic wind direction section 25 virtually isolates the space 31 between the assist fans 24 and the MPs 18 from the rest of the space. In the present embodiment, the second logic wind direction section 25B blocks the air from the lower area entering the space 31, so the air discharged by the assist fans 24 reaches the MPs 18 without being influenced by the air flow from the lower area (without the air coming from the lower area running into the air discharged by the assist fans 24). In other words, the air discharged from the assist fans 24 reaches the MPs 18 without decreasing the flow velocity thereof, or changing the flow direction thereof, or increasing the temperature thereof, by the influence of the air which entered from the lower area. In other words, the fresh air drawn from outside the storage device system 1 (low temperature air which is not yet warmed up by contacting other components and air) is sent from the assist fans 24 to the MPs 18 and cools the MPs 18, so the cooling efficiency for the MPs 18 improves. Also according to this variant form, the entry of the air from the lower area by the logic fans 5 into the space 31 is blocked, so almost all the air discharged from the assist fans 24 reaches the MPs 18, therefore further improvement of the cooling efficiency for the MPs 18 can be expected.

Now this variant form will be described in concrete terms.

The width (width when viewed from the front face is the same in the following description) of the body 4 is assumed to be 650 mm. The width of one passage space 11 is assumed to be 100 mm, and the width of the logic module 2 is assumed to be 400 mm. In this case, for the logic fans 5, six 120 mm square fans are installed, three in the width direction and two in the depth direction, as the logic fans 5.

If only the logic fans 5 cool the cooling objects in the logic module 2, the MP 18 at the top is maintained at about 80° C., and the MP 18 at the bottom is maintained at about 68° C. The heating value of the MPs 18 is about 40 W, and the upper limit temperature thereof is about 58° C. Therefore in this state, the MP 18 cannot be maintained at the upper limit temperature or less.

If two 40 mm$^2$ assist fans 24, of which capacity is about 0.23 m$^3$/min respectively, are added to the above logic fans 5, then the MP 18 disposed at the top and the MP 18 disposed at the bottom are maintained at about 56° C. respectively. In other words, the MPs 18 can be maintained at the upper limit temperature or less by installing the assist fans 24. The capacity of the assist fans 24 and the surface temperature of the MP 18, which is maintained by this cooling due to the assist fans 24, are correlated, which is roughly in reverse proportion. In the present embodiment, the width of the edge surface section 23 is 40 mm, so a 40 mm$^2$ assist fan 24 is used to match this.

Figure 9:
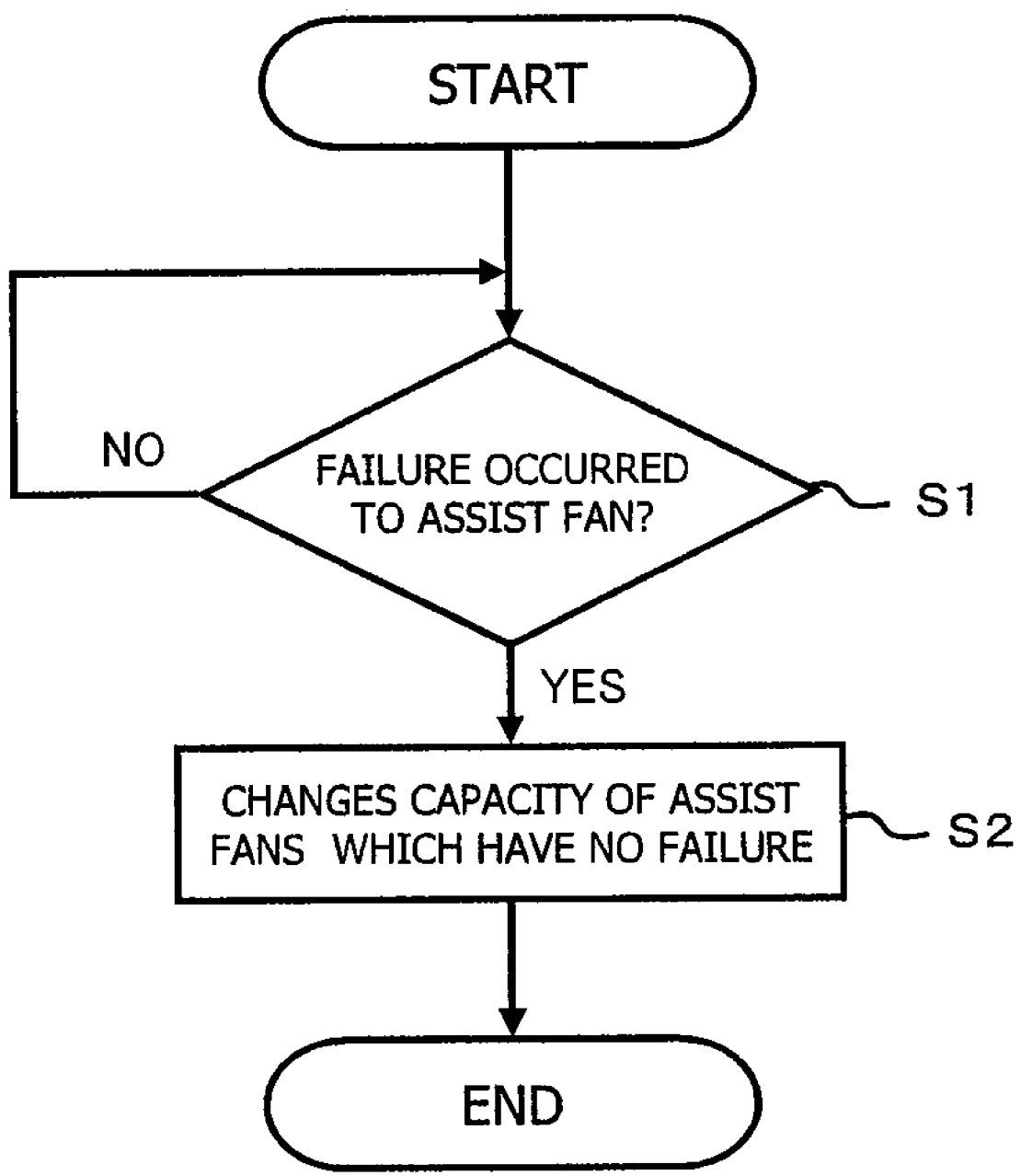
FIG. 9 is a flow chart depicting a processing to control an assist fan.

FIG. 9 is a flow chart depicting the processing for controlling the assist fan 24.

In this example, it is assumed that two assist fans 24 are installed, and each of them has a 0.25 m$^3$/min capacity. This processing is performed by the MPs 18 executing a program loaded in the memory 18.

If a failure occurs to one of the assist fans 24 (S1), the MP 18 which detected the failure or which reported the failure increases the capacity of the other assist fan 24 which is operating normally (S2). In this example, each of the two assist fans 24 maintains a 0.25 m$^3$/min capacity, so the capacity of the other assist fan 24, which is operating normally, is set to double the capacity, 0.5 m$^3$/min, for example.

In the case of a variant form of this processing, where three assist fans 24 are provided and the MP 18 is maintained at the upper limit temperature or less by the operation of the two assist fans out of these, the MP 18 can control as follows. When a failure occurs to one of the assist fans 24 in operation, the MP 18 activates the assist fan 24 in stop status in S2, so that two assist fans 24 can operate.

By such control, the cooling object which the assist fans 24 intensively cool, can be maintained at the upper limit temperature or less, even if one of the plurality of assist fans 24 fails.

The above is a description on the cooling of the storage control device according to the present embodiment.

A configuration example and a functional example of a storage device system 1 comprising this storage control device are as follows.

Figure 10:
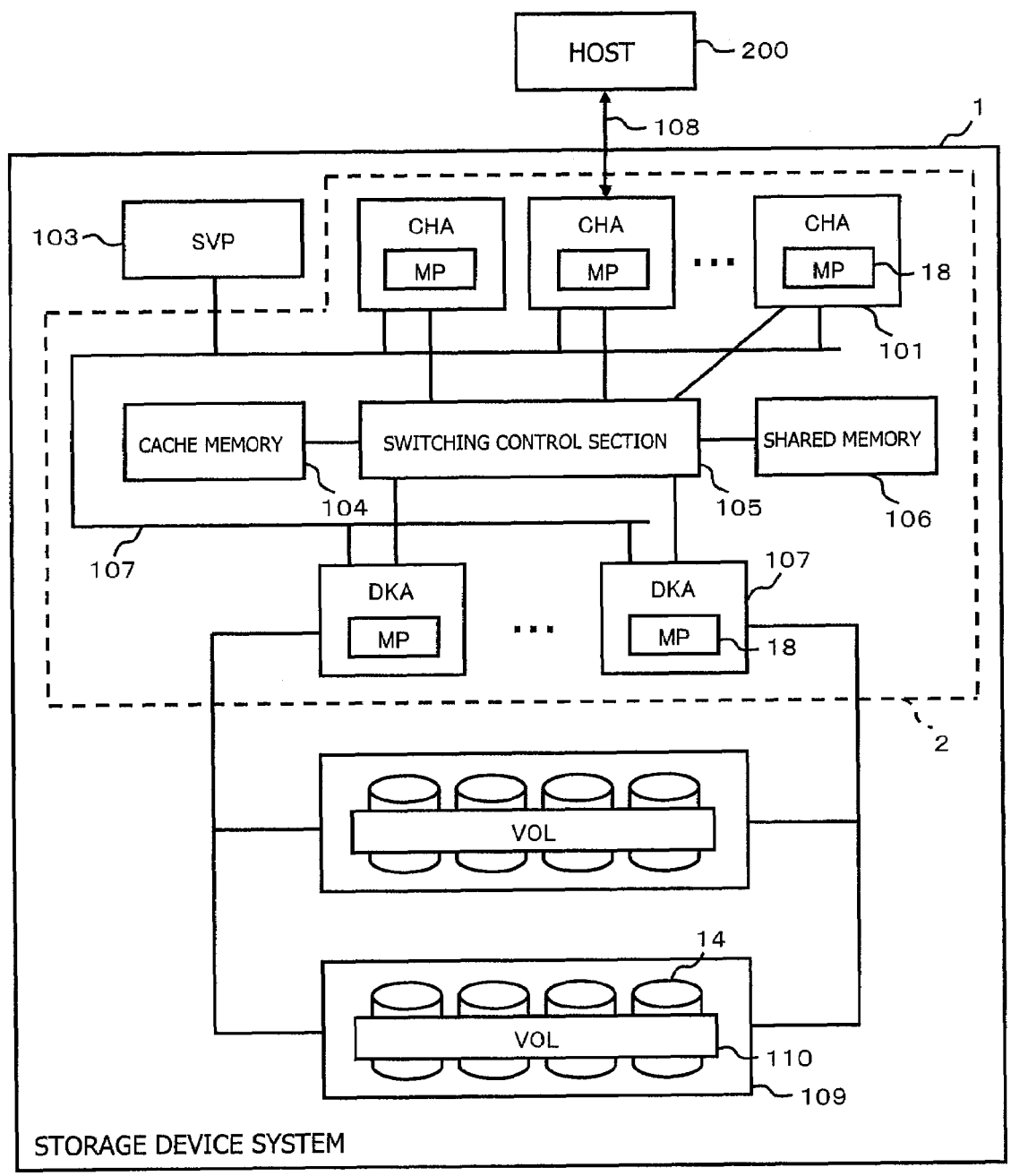
FIG. 10 is a functional block diagram of the storage device system.

FIG. 10 is a functional block diagram depicting the storage device system 1.

The storage device system 1 can perform storage control based on a RAID (Redundant Array of Independent Disks) method, for example. The storage device system 1 comprises a storage control device 2, a RAID group 109 log and a service processor (hereafter SVP) 103, for example. The storage control device, that is a logic module 2, further comprises one or a plurality of channel adapters (hereafter CHA) 101, one or a plurality of disk adapters (hereafter DKA) 107, a cache memory 104, a shared memory 106 and a switching control section 105.

The RAID group 109 includes a plurality of storage devices 14, and provides redundant storage based on RAID, such as RAID1 and RAID5, for example. Each storage device 110 may be a hard disk drive itself, or a device having a hard disk drive in a canister (not illustrated). On a physical storage area provided by each storage device 110, at least one logical volume (hereafter VOL) 110, which is a logical storage area, may be set. In the VOL 110, a plurality of data sent from the host device 200 can be stored.

Each DKA 107 is for controlling data exchange with each storage device 110. Each DKA 107 is constructed as a microcomputer system, including an MP 18, a ROM and a RAM. A plurality of DKAs 107 are installed in the storage device system 1. Each DKA 107 can read data in the block level from the cache memory 104, and write it to the storage device 110, or can write data in the block level, which is read from the storage device 110, to the cache memory 104.

Each CHA 101 receives data from the host device 200 via a connection path 108. The connection path 108 may be a communication network or a dedicated path line.

Each CHA 101 can be constructed as a microcomputer system, just like DKA 107. Each CHA 101 has an MP 18, a DMA controller and a transfer control section, for example.

The cache memory 104 can be constructed using a volatile or a non-volatile semiconductor memory, for example. The cache memory 104 can store data from the host device 200 or data read from the VOL 110.

The shared memory 106 can be constructed using a non-volatile or a volatile semiconductor memory, for example. The shared memory 106 stores various commands received from the host device 200 and the control information used for control of the storage device system 1. The commands and the control information may be redundantly stored by a plurality of shared memories 106. The cache memory 104 and the shared memory 106 may be constructed as separate memories, or a part of a memory may be used as a cache memory area and another part of this memory may be used as a shared memory area.

The switching control section 105 interconnects each CHA 101, each DKA 107, the cache memory 104 and the shared memory 106. The switching control section 105 can be constructed using an ultra high-speed cross bar switch, for example.

The SVP 103 can collect information on each section of the storage device system 1, and monitor them via an internal network (e.g. LAN) 107, for example. The SVP 103 can output the collected information on the internal status as the original raw data, or as statistically processed data, to the external management terminal (not illustrated). The SVP 103 can also receive the input of the information and store it to a predetermined storage area (e.g. memory) in the SVP 103, or send it to the CHA 101 or DKS 107.

The above mentioned embodiments and variant forms of the present invention are examples for describing the present invention, and are not for limiting the scope of the present invention only to these embodiments. The present invention can be embodied in various other modes within the scope of the spirit thereof.

What is claimed is:

1. A disk array device comprising:
a storage unit at an upper side of the disk array device;
a control unit at a lower side of the disk array device;
an air inlet at a position lower than the position of the control unit;
an air outlet between the storage unit and the control unit;
a first cooling fan;
a second cooling fan; and
a third cooling fan,
wherein the control unit is cooled by first air passing through a first passage according to the second fan, the first passage including the air inlet, the control unit and the air outlet;
wherein the storage unit is cooled by second air passing through a second passage according to the first and the second cooling fans, the second passage including the air inlet, outside of the control unit, the second cooling fan, the storage unit and the first cooling fan,
wherein a LOW cooling target is cooled by third air passing through a third passage according to the third cooling fan, the third passage including the air inlet, outside of the control unit, the third cooling fan, the LOW cooling target and the air outlet,
wherein the LOW cooling target is a cooling target among cooling targets in the control unit, and the LOW cooling target has an upper limit temperature which is low, and
wherein the third air is part of the second air passing through the second passage.

2. The disk array device according to claim 1, wherein said cooling targets are disposed on a plurality of logic boards which are disposed in a vertical direction and are arrayed in a width direction of said control unit respectively,
wherein said first cooling fan is a suction type large fan disposed above said plurality of logic boards,
wherein each of said logic boards comprises:
an edge surface section formed at a front edge or rear edge of said logic board,
a discharge type small fan which is said second cooling fan, disposed on said edge surface section at a position facing said LOW cooling target, and
a shield section for preventing air flowing from said suction type large fan from running into air flowing from said discharge type small fan to said LOW cooling target, and
wherein said LOW cooling target is a cooling target of which an upper limit temperature of the surface thereof is lower than an upper limit temperature of the surface of a cooling target other than said LOW cooling target.

3. The disk array device according to claim 2, wherein a plurality of LOW cooling targets are disposed on said logic boards at positions shifted in a vertical direction of said control unit, and a plurality of discharge type small fans are installed on edge surface sections at a plurality of positions corresponding to said plurality of LOW cooling target respectively.

4. The disk array device according to claim 2, wherein said shield section is a wall extending on said edge surface section, from a position where said discharge type small fan is installed or a position lower than said position where said discharge type small fan is installed to a bottom end of said LOW cooling target, or a position lower than the bottom end of said LOW cooling target.

5. The disk array device according to claim 3, wherein said wall acts as a guide for guiding air discharged by said small fan to said LOW cooling target.

6. The disk array device according to claim 2, wherein a size of said discharge type small fan is larger than the size of said LOW cooling target, and each of said logic boards further comprises an air drawing section for drawing the air discharged from said discharge type small fan into a surface of said LOW cooling target.

7. The disk array device according to claim 6, wherein said shield section and said air drawing section are provided on said edge surface section.

8. The disk array device according to claim 2, wherein each of said logic boards comprises a memory module which is installed at a position lower than the center of the logic board and which extends in a depth direction of said control unit, and a wind direction section for directing air flowing up from both sides of said memory module by said suction type large fan to the center side of the logic board, and
wherein said wind direction section is installed at the top end of said logic board.

9. The disk array device according to claim 1, wherein said LOW cooling target is disposed at a position closer to said second cooling fan than said first cooling fan, and
wherein a cooling capability of said second cooling fan is lower than a cooling capability of said first cooling fan.

10. The disk array device according to claim 1, wherein said LOW cooling target is a cooling target of which an upper limit temperature of the surface thereof is lower than an upper limit temperature of the surface of cooling targets other than said LOW cooling target.

11. The disk array device according to claim 1, wherein said cooling targets are disposed on a plurality of logic boards which are disposed in said control unit,
wherein said first cooling fan is a suction type fan and said second cooling fan is a discharge type fan,
wherein air sucked from outside said disk array device into inside said disk array device by said discharge type fan cools said LOW cooling target, and
wherein air, which is sucked into said disk array device by said suction type fan, and which cools said plurality of cooling targets including said LOW cooling target, in each of said logic boards, and air, which is discharged into said disk array device by said discharge type fan, and which cools said LOW cooling target, are discharged out of said disk array device by said suction type fan.

12. The disk array device according to claim 1, wherein said cooling targets are disposed on a plurality of logic boards which are disposed in said control unit,
wherein said second cooling fan is a cooling fan smaller in size than said first cooling fan, and
wherein each of said logic boards comprises an edge surface section which is formed on the front edge and/or the rear edge of said logic board, and a discharge type fan disposed on said edge surface section, at a position facing said special cooling object.

13. The disk array device according to claim 1, wherein said cooling targets are disposed on a plurality of logic boards which are disposed in said control unit,
wherein a direction of air flow by said first cooling fan and a direction of air flow by said second cooling fan are different, and
wherein each of said logic boards further comprises a shield section for preventing air flowing by said first cooling fan from running into air flowing from said second cooling fan to said LOW cooling target.

14. The disk array device according to claim 13, wherein said shield section plays acts as a guide for guiding air discharged by said second cooling fan into said LOW cooling target.

15. The disk array device according to claim 1, wherein a plurality of said second cooling fans are provided, and
wherein the disk array device further comprising:
a cooling control section for increasing, when a failure occurs to any of said plurality of second cooling fans, a cooling capability of the second cooling fans other than said failed second cooling fan.

16. A storage control device for controlling a storage device, comprising:
a plurality of logic boards having a plurality of cooling targets;
a first cooling fan for cooling said plurality of cooling targets on each of said logic boards; and
a second cooling fan for cooling at least one LOW cooling target out of said plurality of cooling targets on each of said logic boards,
wherein said cooling targets are disposed on said logic boards which are disposed in a vertical direction and are arrayed in a width direction of said control unit respectively,
wherein said first cooling fan is a suction type large fan disposed above said plurality of logic boards,
wherein each of said logic boards comprises:
an edge surface section formed at a front edge or rear edge of said logic board,
a discharge type small fan which is said second cooling fan, disposed on said edge surface section at a position facing said LOW cooling target, and
a shield section for preventing air flowing from said suction type large fan from running into air flowing from said discharge type small fan to said LOW cooling target, and
wherein said LOW cooling target is a cooling target of which an upper limit temperature of the surface thereof is lower than an upper limit temperature of the surface of a cooling target other than said LOW cooling target.

17. The disk array device according to claim 16, wherein a plurality of LOW cooling targets are disposed on said logic boards at positions shifted in a vertical direction of said control unit, and a plurality of discharge type small fans are installed on edge surface sections at a plurality of positions corresponding to said plurality of LOW cooling target respectively.

18. The disk array device according to claim 16, wherein said shield section is a wall extending on said edge surface section, from a position where said discharge type small fan is installed or a position lower than said position where said discharge type small fan is installed to a bottom end of said LOW cooling target, or a position lower than the bottom end of said LOW cooling target.

19. The disk array device according to claim 17, wherein said wall acts as a guide for guiding air discharged by said small fan to said LOW cooling target.

20. The disk array device according to claim 16, wherein a size of said discharge type small fan is larger than the size of said LOW cooling target, and each of said logic boards further comprises an air drawing section for drawing the air discharged from said discharge type small fan into a surface of said LOW cooling target.

21. The disk array device according to claim 20, wherein said shield section and said air drawing section are provided on said edge surface section.

22. The disk array device according to claim 16, wherein each of said logic boards comprises a memory module which is installed at a position lower than the center of the logic board and which extends in a depth direction of said control unit, and a wind direction section for directing air flowing up from both sides of said memory module by said suction type large fan to the center side of the logic board, and
wherein said wind direction section is installed at the top end of said logic board.

23. A storage control device for controlling a storage device, comprising:
a plurality of logic boards having a plurality of cooling targets;
a first cooling fan for cooling said plurality of cooling targets on each of said logic boards; and
a second cooling fan for cooling at least one LOW cooling target out of said plurality of cooling targets on each of said logic boards,
wherein said second cooling fan is a cooling fan smaller in size than said first cooling fan, and
wherein each of said logic boards comprises an edge surface section which is formed on the front edge and/or the rear edge of said logic board, and a discharge type fan disposed on said edge surface section, at a position facing said special cooling object.

* * * * *